United States Patent [19]

Li et al.

[11] Patent Number: 4,615,039

[45] Date of Patent: Sep. 30, 1986

[54] DATA NETWORK DRIVER

[75] Inventors: Gabriel M. Y. Li, San Francisco; Charles P. Carinalli, Sunnyvale; Ramanatha V. Balakrishnan, San Jose, all of Calif.

[73] Assignee: National Semiconductor Corporation, Santa Clara, Calif.

[21] Appl. No.: 655,809

[22] Filed: Oct. 1, 1984

[51] Int. Cl.$^4$ .................... H04B 3/00; H03K 17/56
[52] U.S. Cl. .................... 375/36; 370/85; 328/57
[58] Field of Search .................... 375/8, 36, 60, 68, 70; 370/85; 455/58; 340/825.5; 333/13; 328/57

[56] References Cited

U.S. PATENT DOCUMENTS

| | | | |
|---|---|---|---|
| 4,075,606 | 2/1978 | Wilkens | 375/36 |
| 4,320,520 | 3/1982 | Graham | 375/36 |
| 4,337,465 | 6/1982 | Spracklen et al. | 375/36 |
| 4,376,278 | 3/1983 | Jacobsthal | 370/85 |
| 4,411,004 | 10/1983 | Graham | 375/36 |

OTHER PUBLICATIONS

Millman & Halkias, Integrated Electronics: Analog and Digital Circuits and Systems, McGraw-Hill, 1972, pp. 580–581.
Intel Corporation, 1982, Publication No. 82501, "Ethernet Serial Interface".
Advanced Micro Devices, 1983, Publication No. Am7991A, "Serial Interface Adapter (SIA)".

*Primary Examiner*—Benedict V. Safourek
*Assistant Examiner*—Raymond C. Glenny
*Attorney, Agent, or Firm*—Gail W. Woodward; Paul J. Winters

[57] ABSTRACT

An improved driver for differentially driving a differentially conducting cable (e.g., for Ethernet) minimizes the output offset signal coupled to the cable when the driver is idle. When driven to an idle state, the driver provides a shaped output which transitions to a quiescent output level in a manner which eliminates output signal common mode step change and consequently reduces signal distortion on the cable due to reflection of the step change.

8 Claims, 3 Drawing Figures

DATA NETWORK DRIVER

BACKGROUND OF THE INVENTION

The invention relates to communications systems which transfer data between a plurality of nodes all of which are connected to a common conducting cable, particularly a cable that differentially conducts data signals.

There is an increasing use of local area network systems for the transfer of information between a plurality of information processing sites. A number of standards have been promulgated by the industry which characterize and define structure and operation of such systems. One such standard is the Ethernet system which ties together a plurality of information nodes on a common databus. An Ethernet node includes a cable-transceiver interface which taps the Ethernet bus and communicates with data terminal terminal equipment through an Ethernet drop cable. Signals are transmitted differentially on the Ethernet drop cable and an Ethernet information node must include a cable driver capable of differentially driving the cable according to the Ethernet specification.

One mode of signal transmission on the Ethernet drop cable involves the use of inductive coupling to place a differential signal on the cable. In this mode, when a transmitter is idle, that is when the node is not transmitting, the transmitter output must provide a zero differential in order to minimize the total offset voltage present on the cable. Another specification requires that the waveform provided by a transmitter when it ends an active transmission and transitions to its idle state remain at one level for a minimum period of time and then transition to the zero differential level.

One integrated circuit family that is easily adapted to the differential transmission requirements of the Ethernet standard is the ECL family. An ECL driver characteristically responds to an input which can be driven differentially to produce a differential output. One problem with using an ECL driver to interface a node with an Ethernet transmission cable is that its open loop voltage gain is high, typically in the range of 20-30, which tends to amplify input and internal parametric offset voltages.

Further, the conventional ECL circuitry involved in meeting the active-to-idle transition requirement changes the output voltage abruptly, resulting in a common mode step change in the differential outputs which is propagated and reflected in the Ethernet cable.

The present invention is used to advantage as an Ethernet driver. It employs a minimum of internal circuitry to perform the dual function of minimizing the output offset voltage during the idle state and meeting the transition requirement without introducing an output common mode step change into the cable.

SUMMARY OF THE INVENTION

The present invention is directed to a data network driver for transmitting data signals on a differentially-conducting cable, such as an Ethernet drop cable. The driver includes a differentially-driven input section that responds to a data signal to be transmitted by providing a differential transmission driving signal representative of the data signal.

The driver also includes an idle circuit coupled to the input circuit for selectively disabling the circuit from providing a transmission driving signal while, at the same time, providing an idle signal of adjustable characteristics.

Both the input and idle circuits are coupled to an output circuit having an output port connected to the differentially-conducting cable and responsive to a driving signal for providing a differential data signal through the port. The output circuit further responds to the idle signal by providing, through the output port, a quiescent signal whose characteristics are dependent upon the characteristics of the idle signal.

Finally the driver includes an adjustment circuit coupled to the output port and to the idle circuit for measuring the difference between respective characteristics of the quiescent and differential data signals and for, based upon the measurement, adjusting the characteristics of the idle signal.

Therefore it is a primary object of the present invention to provide an improved data network driver for transmitting data signals on a differentially-conducting cable.

It is a further object of present invention to provide such a driver which couples a minimum output offset voltage onto the cable when the driver is idle.

It is yet another object of the invention to provide such a driver whose output grandually transitions, at the end of a data transmission, to a predetermined quiescent state.

Other objects and advantages of the present invention will become more evident when the following detailed description is read in conjunction with the described drawings.

DETAILED DESCRIPTION OF THE PREFERRED EMBODIMENT

A driver which is useful to provide the transmitting interface for a differentially-driven communications system such as Ethernet is described. Although references are made to specific requirements of the Ethernet system which are satisfied by the described driver, it should be evident that the driver can be used to place a differential signal on any differentially-driven communications cable with a minimum of output offset when the driver is idling and without coupling a common mode step change onto the cable when the driver becomes active. Therefore, it is to be understood that the quantities which below characterize the operation of the invention are merely for purposes of illustration, and are not intended to limit its use or application.

Figure 1:
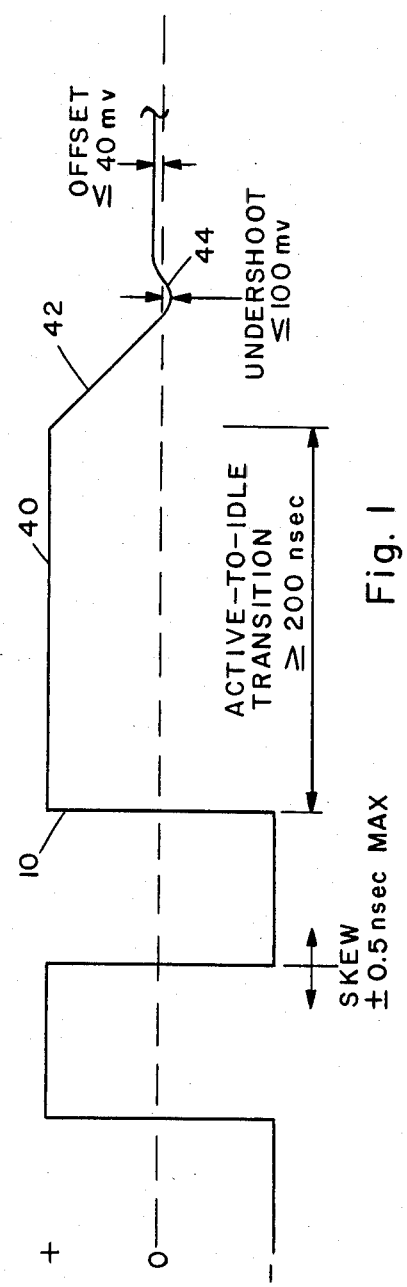
FIG. 1 is a waveform which represents selected characteristics required of an Ethernet cable driver.

Referring now to FIG. 1, there is illustrated an idealized differential waveform which represents certain characteristics required of the output of a driver which is inductively coupled to an Ethernet system. The output waveform provided by the driver is a differential one and transitions between a positive voltage state signified by "+" and a negative state signified by "−". The average level is positioned between the two states and has a zero voltage level signified in the figure by "0". At the end of a data transmission, the output waveform transitions at waveform edge 10 to an active-toidle transition state where the output wave form must remain at the + level for at least 200 nanoseconds before transitioning to the zero differential level midway between the + and − levels. Because the driver is inductively coupled, it is recognized that there will be an undershoot when the waveform transitions to the quiescent level, however, the undershoot must be no greater than 100 millivolts. Finally, while the driver is in the idle state it must provide an output offset voltage of no greater than 40 millivolts.

Figure 2:
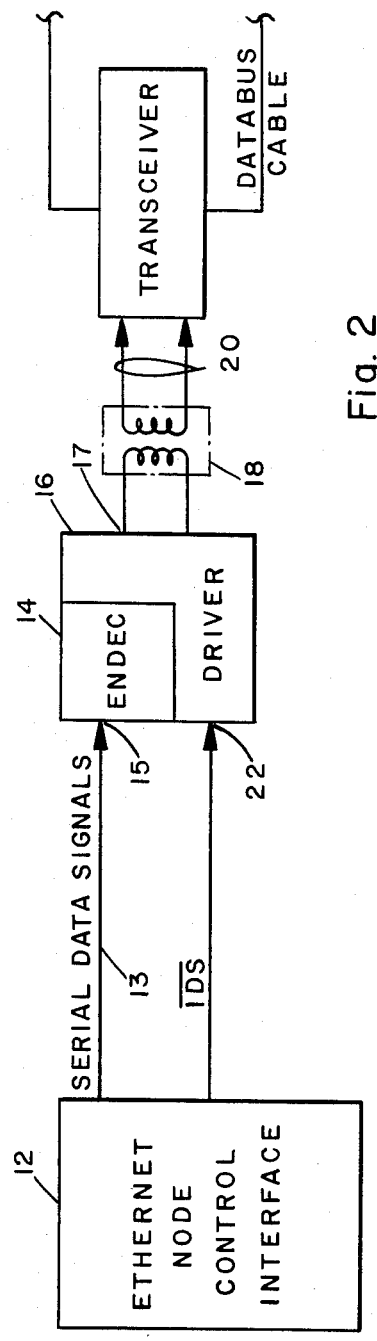
FIG. 2 is a block diagram which shows a driver of the invention in a representative operational environment.

The typical system environment in which the driver's specifications illustrated in FIG. 1 obtain is illustrated in FIG. 2. Typically, the Ethernet system involves a plurality of nodes through which data is exchanged with the system. One such node is illustrated in FIG. 2 and includes a node control interface 12 which accepts parallel digital data, formats it, and provides it serially to a node encoder-decoder (ENDEC) 14 through an input node 15. ENDEC encodes data signals into a differential digital format. In the FIG. 2 example, the ENDEC 14 interfaces with the driver 16 of the invention by providing the encoded data signals as an input to the driver. The driver 16 responds to the input encoded data signals by providing a differential output signal to an inductive coupler 18, which differentially couples the output signal of the driver to a differentially-conducting drop cable 20. The signals are conducted over the drop cable to a transceiver which couples them into the Ethernet data bus cable.

In order to signal the end of the data transmission and the beginning of the idle state, Ethernet control interface 12 provides a negative-logic idle data signal (IDS) through an idle port 22 to the driver 16. The driver 16 responds to $\overline{IDS}$ by providing an output voltage waveform which follows the active-to idle transition to the quiescent output level as illustrated by the waveform of FIG. 1.

Figure 3:
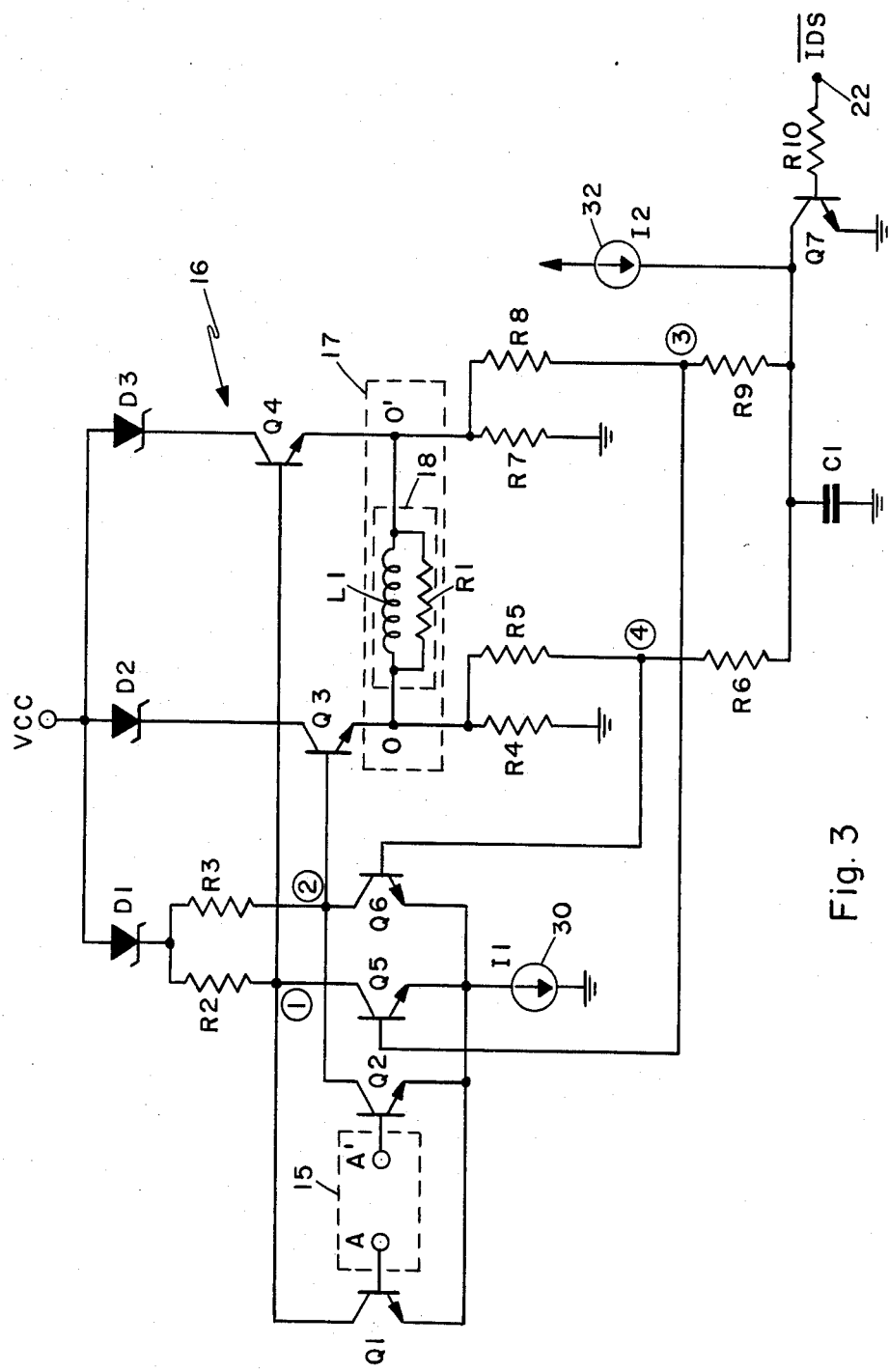
FIG. 3 is a detailed circuit diagram illustrating the data network driver of the invention.

The driver 16 of the invention can be understood with reference to FIG. 3. The driver receives the encoded data signals through the input port 15 which includes a pair of nodes A and A' that receive the encoded differential data signals which are to be transmitted on the system drop cable 20. Node A is connected to the base of a transistor $Q_1$, while the node A' is connected to the base of a transistor $Q_2$. The emitters of $Q_1$ and $Q_2$ are connected in common to a conventional constant current source 30 which provides a constant current $I_1$. The collectors of $Q_1$ and $Q_2$ are connected to the bases of emitter followers $Q_3$ and $Q_4$, respectively. The collector of $Q_1$ is further connected at a node 1 to one side of a resistor $R_2$, the other side of which is connected through a diode $D_1$ to a positive source of DC voltage $V_{cc}$. Similarly, the collector of $Q_2$ is further connected at a node 2 to one side of a resistor $R_3$ that is connected at its other side to the cathode of diode $D_1$ in common with the resistor $R_2$.

The transistors $Q_3$ and $Q_4$ are conventional emitter followers whose collectors are connected through diodes $D_2$ and $D_3$, respectively, to $V_{cc}$. The output signal of the driver 16 is developed between the nodes 0' and 0 connected to the emitters of $Q_3$ and $Q_4$, respectively. The + portion of the output signal is developed at node 0 by the resistor $R_4$ which is connected between the nodes 0 and ground. The − portion of the output signal is developed across $R_7$, connected between node 0' and ground.

The coupler 18 which is connected across the nodes 0 and 0' of the output port 17 is represented by an inductance $L_1$ and a resistance $R_1$.

The idle section of the driver 16 includes a pair of transistors $Q_5$ and $Q_6$ connected in conventional coupled-emitter configuration between node 1 and node 2, respectively, and the current source 30. The base of $Q_5$ is connected through a node 3 and a resister $R_9$ to the collector of a transistor $Q_7$. Similarly, the base of $Q_6$ is connected through a node 4 and a resistor $R_6$ to $Q_7$'s collector. Also connected to the collector of $Q_7$ are a capacitor $C_1$ and another constant current source 32 providing a current $I_2$. The base of $Q_7$ is connected through a resistor $R_{10}$ to the idle port 22 through which $\overline{IDS}$ is provided to the driver 16. The emitter of $Q_7$ is connected to ground.

A quiescent output offset adjustment circuit provided in the driver 16 includes a pair of feedback resistors $R_5$ and $R_6$ connected in series between output node 0 and one side of the capacitor $C_1$. The adjustment circuit further includes a pair of resistors $R_8$ and $R_9$ connected in series between the other output node O' and the other side of the capacitor $C_1$. A feedback signal is obtained at node 4 between $R_5$ and $R_6$ which is connected to the base of $Q_6$. Another feedback signal is obtained at node 3 between $R_8$ and $R_9$ which is fed to the base $Q_5$.

During normal operation, when encoded data signals (which can comprise a pair of complementary logic signals) are provided to the driver 16 for transmission onto drop cable 20, the signals operate $Q_1$ and $Q_2$. The positive portion of the input differential data signal is provided at node A of the input port 15 and drives the transistor $Q_1$. The negative portion of the differential encoded data signal is provided node A' and drives the transistor $Q_2$. At the same time that the differentially-coded data signal is provided at the input port 15 of the driver, IDS is deactivated, placing it in a positive logic voltage level and turning on $Q_7$. When operating, $Q_7$ diverts the current $I_2$ to ground. Further, $Q_7$ discharges the capacitor $C_1$ and keeps the bases of $Q_5$ and $Q_6$ at a low voltage level, which keeps the transistors $Q_5$ and $Q_6$ turned off.

Therefore, while the driver 16 is employed to transmit data signals provided at the input port 15, the transistors $Q_1$ and $Q_2$ are driven in a conventional differential fashion, with the current $I_1$ being switched to the transistor that is currently turned on. The differential action of $Q_1$ and $Q_2$ develops a differential driving signal between nodes 1 and 2 which drives the emitter followers $Q_3$ and $Q_4$ in conventional differential fashion. For example, when the signal provided at the port 15 exhibits transition to a positive level, the voltage level at node A rises while that at A' drops and $I_1$ is diverted through $Q_1$. This causes the voltage at node 2 to rise relative to that at node 1, resulting in a higher voltage at node 0 than at node 0'. The voltage difference between the nodes 0 and 0' develops a voltage potential across the parallel combination of $L_1$ and $R_1$ which is coupled conventionally into the drop cable 20 with a polarity determined by the higher voltage at output node 0 and the lower voltage at the node 0'. Conversely, when the polarities of the signals at the input node 15 invert, the process described above reverses and reverses the polarity between the nodes 0 and 0'. In this manner, the drop cable 20 is differentially driven through the output port 17 by the input signals applied to the input port 15.

When the node control interface 12 terminates data transmission, it provides the idle signal $\overline{IDS}$ to the input node 22 which will cause the driver 16 to place a positive-polarity constant-voltage signal, such as is represented by section 40 of the FIG. 1 waveform, on the drop cable 20. At this time, the waveform of FIG. 1 changes, at transition 10, to the level 40, and the driver returns to the idle state. The low active level of $\overline{IDS}$ turns $Q_7$ off. With $Q_7$ off, the current $I_2$ charges the capacitor $C_1$ at a rate of $I_2/C_1$ (volts/second). The potential at nodes 3 and 4 rises at the rate with which the capacitor $C_1$ charges. When the potential at these nodes exceeds the level of the input signal at the port 15, $Q_5$ and $Q_6$ turn on. $Q_5$ and $Q_6$ assume substantially identical operating points and so divide $I_1$ evenly between themselves so that $I_1/2$ flows through each transistor. The equal operating levels of $Q_5$ and $Q_6$ causes the nodes 1 and 2 to assume substantially equal voltage levels, thereby biasing the emitter followers $Q_3$ and $Q_4$ equally. In the preferred embodiment, $R_4$ and $R_7$ have equal resistance values so that the currents flowing through $Q_3$ and $Q_4$ are equal as are the voltages developed at the output nodes O and O'.

Since, in the idle state, the output nodes O and O' are at equal potentials, a zero potential is developed across the coupler and the output voltage signal coupled through the port 17 to the cable 20 assumes the 0 voltage level, midway between the maximum + and − levels of the FIG. 1 waveform. However, because of the mismatches in the transistor pairs $Q_5$-$Q_6$ and $Q_3$-$Q_4$ and the resistor pairs $R_2$-$R_3$ and $R_4$-$R_7$, the voltages developed at the output nodes O and O' are unequal and an output offset voltage is developed. The objective of the Ethernet spcification is to keep this offset voltage below a standard maximum level which, in FIG. 1 is numeral 40 millivolts. Since there is a voltage gain G from the transistor pair $Q_5$-$Q_6$ to the output port, then the input offset developed in the respective circuits of that transistor pair must be kept well below 40/G. Since, a typical value for G is 23, then the voltage offset between nodes 3 and 4 must be kept well below two millivolts.

The output offset adjustment circuit comprising the resistors $R_5$-$R_6$ and $R_8$-$R_9$ measures the output offset voltage and develops a differential feedback voltage having a polarity which tends to force the output offset voltage toward the zero voltage level. For example, if the voltage at output node 0 exceeds that at the output node 0', an incremental feedback voltage $\Delta V_f$ having a value given by equation (1) is fed to the base of $Q_6$.

$$\Delta V_f = \left( \frac{R_6}{R_5 + R_6} \right) \Delta V_0$$

where $\Delta V_0$ = the incremental voltage change at node 0.

This increases the bias level at the base of $Q_6$, turning it on harder relative to $Q_5$ and lowering the voltage potential at node 2. The lower potential at node 2 relative to that at node 1 causes $Q_3$ to conduct forward current at a level proportionately less than that conducted by $Q_4$, which causes the voltage at the output node O to fall relative to that at node O', thus reducing the differential between them and the output voltage offset level.

Obviously, many modifications and variations of the described invention are possible in light of the above teachings, and it is therefore understood that the invention may be practiced otherwise than as it has been specifically described.

We claim:

1. A data network driver for producing output data signals corresponding to input differential data signals from a transmission controller and provided on a differentially-conducting medium, comprising:

input means responsive to an input differential data signal for providing a transmission driving signal representative of said differential data signal;

idle means coupled to said input means for selectively disabling said input means from providing said transmission driving signal and for, when said input means is disabled, providing an idle signal having adjustable characteristics;

output means having an output port connected to said medium and responsive to said transmission driving signal for providing an output data signal through said output port in response to said transmission driving signal and for providing, through said port and in response to said idle signal, a quiescent signal having a transition interval determined by said idle signal followed by a substantially zero signal level; and adjustment means coupled to said output port and to said idle means for measuring the differential level of said quiescent signal and for, based upon said measurement, adjusting the characteristics of said idle signal to reduce said differential level.

2. The transmitter of claim 1 wherein said transmission controller provides an idle data signal when said driver is to provide said quiescent signal and said idle means includes switched current means responsive to said idle data signal for providing a charging current and capacitive means accumulating a charge at a predetermined rate in response to said charging current for producing, based on said charge, said idle signal.

3. The transmitter of claim 1 wherein said output data signal is a differential signal, said output port is a differential port having two nodes, and said measured difference is the voltage difference between said two nodes.

4. The transmitter of claim 3 wherein said transmission controller provides a multi-state idle control signal and said idle means is responsive to a first state of said idle control signal for disabling said input means and providing said idle signal and to a second state of said idle control signal for enabling said input means to respond to an input data signal.

5. The transmitter of claim 4 wherein said idle means includes a pair of idle transistors whose emitters are commonly connected to a constant current source and a capacitor commonly connected to said switched current means and to the respective bases of said idle transistors and said idle signal includes the respective collector voltages of said idle transistors.

6. The transmitter of claim 5 wherein said output means includes a pair of emitter follower transistors, each having a base connected to receive a respective idle transistor collector voltage and an emitter connected to an emitter impedance substantially equal to the emitter impedance of the other emitter follower transistor, and a respective output port node is connected between each of said emitters and its associated impedance.

7. A transmitter having an input port receiving a differential input data signal, an idle port receiving an idle control signal, and an output port connected to a differentially-driven conduction medium, comprising:

differential circuit means connected between said input and output port for, in response to said differential input data signal, providing through said output port, a differential data signal representative of said input data signal;

an idle circuit connected between said idle port and said differential circuit means for selectively preventing said differential circuit means from providing a differential data signal while causing said idle circuit means to provide an adjustable quiescent signal through said output port wherein said differential circuit means adjusts said quiescent signal in response to said idle control signal;

first means, in said idle circuit, including capacitive means and switched current means responsive to said idle control signal for providing a capacitor charging current for accumulating a charge at a predetermined rate for adjusting said quiescent signal to a predetermined level and at a predetermined rate based upon said charge; and second means, in said idle circuit for, after said quiescent signal has been adjusted substantially to said predetermined level, maintaining said quiescent signal within a predetermined offset signal level range of said predetermined level.

8. The transmitter of claim 7 wherein said second means for maintaining includes a resistive feedback circuit connected between said output port and said second means.

* * * * *